(12) United States Patent
Zhang et al.

(10) Patent No.: US 11,909,172 B2
(45) Date of Patent: Feb. 20, 2024

(54) METHOD FOR MANUFACTURING OPTICAL DEVICE AND OPTICAL DEVICE

(71) Applicants: ASAHI KASEI KABUSHIKI KAISHA, Tokyo (JP); National University Corporation Tokai National Higher Education and Research System, Nagoya (JP)

(72) Inventors: Ziyi Zhang, Tokyo (JP); Maki Kushimoto, Nagoya (JP); Hiroshi Amano, Nagoya (JP)

(73) Assignees: ASAHI KASEI KABUSHIKI KAISHA, Tokyo (JP); National University Corporation Tokai National Higher Education and Research System, Nagoya (JP)

( * ) Notice: Subject to any disclaimer, the term of this patent is extended or adjusted under 35 U.S.C. 154(b) by 196 days.

(21) Appl. No.: 17/141,223

(22) Filed: Jan. 5, 2021

(65) Prior Publication Data

US 2021/0210924 A1  Jul. 8, 2021

Related U.S. Application Data

(60) Provisional application No. 62/958,397, filed on Jan. 8, 2020.

(51) Int. Cl.
*H01S 5/026* (2006.01)
*H01S 5/22* (2006.01)
(Continued)

(52) U.S. Cl.
CPC .......... *H01S 5/0264* (2013.01); *H01S 5/0201* (2013.01); *H01S 5/0287* (2013.01);
(Continued)

(58) Field of Classification Search
CPC ..... H01S 5/0262; H01S 5/0287; H01S 5/0288
See application file for complete search history.

(56) References Cited

U.S. PATENT DOCUMENTS 5,258,991 A * 11/1993 Peterson ............... H01S 5/0264
257/85
5,394,426 A   2/1995 Joslin
(Continued)

FOREIGN PATENT DOCUMENTS

CN   114144950 A * 3/2022 ........... H01S 5/0014
JP   S62296585 A   12/1987
(Continued)

OTHER PUBLICATIONS

Ziyi Zhang et al., A 271.8 nm deep-ultraviolet laser diode for room temperature operation, The Japan Society of Applied Physics, 2019, vol. 12, No. 12.

*Primary Examiner* — Tod T Van Roy
(74) *Attorney, Agent, or Firm* — KENJA IP LAW PC

(57) ABSTRACT

An object of the present invention is to provide a method for manufacturing an optical device having a laser diode, which method is suitable for mass production, and an optical device having a laser diode which allows accurate property evaluations thereof with small measurement errors. Specifically, the method includes: an etching process of etching a semiconductor lamination unit to form a mesa structure having a resonator end face, thereby forming a laser diode; and a reflecting layer forming process of forming a light reflecting layer such that the light reflecting layer covers entire side surfaces of the mesa structure, wherein the semiconductor lamination unit has a substate, a n-type clad layer including a nitride semiconductor layer having n-type conductivity, a light-emitting layer including at least one quantum well, and a p-type clad layer including a nitride (Continued)

semiconductor layer having p-type conductivity, laminated in this order.

9 Claims, 9 Drawing Sheets

(51) Int. Cl.
   *H01S 5/02*      (2006.01)
   *H01S 5/40*      (2006.01)
   *H01S 5/028*     (2006.01)
   H01S 5/34        (2006.01)
   H01S 5/32        (2006.01)
(52) U.S. Cl.
   CPC .............. *H01S 5/22* (2013.01); *H01S 5/4031* (2013.01); *H01S 5/3215* (2013.01); *H01S 5/34* (2013.01); *H01S 2301/176* (2013.01); *H01S 2304/04* (2013.01)

(56) References Cited

U.S. PATENT DOCUMENTS

| | | | | |
|---|---|---|---|---|
| 5,851,849 | A * | 12/1998 | Comizzoli | H01S 5/028 372/49.01 |
| 6,289,030 | B1 * | 9/2001 | Charles | H01L 31/02161 372/49.01 |
| 6,835,581 | B2 * | 12/2004 | Fitz | H01S 5/028 438/22 |
| 6,856,637 | B2 * | 2/2005 | Tsumori | H04B 10/501 372/38.1 |
| 7,609,737 | B2 * | 10/2009 | Matsumura | H01S 5/028 372/45.01 |
| 7,807,954 | B2 * | 10/2010 | Yoneda | H01S 5/0264 250/208.2 |
| 7,935,550 | B2 * | 5/2011 | Dwilinski | C30B 29/403 117/11 |
| 9,893,489 | B2 * | 2/2018 | Leobandung | H01S 5/021 |
| 10,103,517 | B2 * | 10/2018 | Behfar | H01S 5/0282 |
| 10,218,150 | B2 * | 2/2019 | Leobandung | H01S 5/021 |
| 10,454,239 | B2 * | 10/2019 | Leobandung | H01S 5/021 |
| 11,088,508 | B2 * | 8/2021 | Yuen | H01L 33/105 |
| 11,211,769 | B2 * | 12/2021 | Nakamura | H01S 5/0203 |
| 2002/0064196 | A1 * | 5/2002 | Shiozawa | H01S 5/2231 372/45.01 |
| 2003/0116767 | A1 * | 6/2003 | Kneissl | H01S 5/34333 257/79 |
| 2004/0062282 | A1 * | 4/2004 | Matsuoka | B82Y 20/00 372/45.013 |
| 2008/0137701 | A1 * | 6/2008 | Freund | H01S 5/32341 257/14 |
| 2008/0237452 | A1 * | 10/2008 | Yoneda | H01S 5/0264 250/214 R |
| 2016/0164260 | A1 | 6/2016 | Chua et al. | |
| 2017/0063028 | A1 | 3/2017 | Leobandung et al. | |
| 2019/0348568 | A1 | 11/2019 | König et al. | |
| 2019/0356108 | A1 * | 11/2019 | Matsuhama | H01S 5/0217 |
| 2021/0210924 | A1 * | 7/2021 | Zhang | H01S 5/4031 |
| 2022/0337035 | A1 * | 10/2022 | Zhang | H01S 5/026 |

FOREIGN PATENT DOCUMENTS

| | | |
|---|---|---|
| JP | 07030197 A * | 1/1995 |
| JP | H11340580 A | 12/1999 |
| JP | 2002319743 A | 10/2002 |
| JP | 2014003329 A | 1/2014 |
| JP | 2016111353 A | 6/2016 |
| JP | 2019197894 A | 11/2019 |
| WO | WO-2022158557 A1 * | 7/2022 |

* cited by examiner

METHOD FOR MANUFACTURING OPTICAL DEVICE AND OPTICAL DEVICE

CROSS REFERENCE TO RELATED APPLICATION

This application claims priority of U.S. Provisional Patent Application Ser. No. 62/958,397, filed on Jan. 8, 2020, the entire disclosures of which are incorporated herein by reference.

TECHNICAL FIELD

The present invention relates to a method for manufacturing an optical device and the optical device thus manufactured. Specifically, the present invention relates to a method for manufacturing an optical device having a laser diode and the optical device having a laser diode thus manufactured.

BACKGROUND ART

A laser diode is manufactured by forming two mirror end faces such that they are in parallel with and face each other and then generally providing the end faces with reflection layers for decreasing threshold values, respectively, by using appropriate techniques. NPL 1 discloses a general technique of forming a mirror end face of a laser diode. Specifically, NPL 1 discloses a method for exposing an orthogonal and smooth end face by splitting a semiconductor crystal along a natural cleavage plane thereof.

CITATION LIST

Patent Literature

PTL 1: U.S. Pat. No. 5,394,426

Non-Patent Literature

NPL 1: Z. Zhang, M. Kushimoto, T. Sakai, N. Sugiyama, L. J. Schowalter, C. Sasaoka and H. Amano, Appl. Phys. Express. 12, 124003 (2019)

SUMMARY OF THE INVENTION

Technical Problems

However, in the conventional method of exposing a resonator end face by splitting crystal along a natural cleavage plane thereof, handling of minutely divided laser bars is inevitably required as disclosed in PTL 1 when a reflection layer is provided by coating on the resonator end face, whereby there arises a problem that the method is not suitable for mass production. Further, in a laser diode obtained by the conventional method, it is difficult to carry out property evaluations of the laser diode accurately and errors tend to occur in measurements using the laser diode because of light emitted from portions other than resonator end faces, which light is referred to as "stray light".

In view of this, an object of the present invention is to provide a method for manufacturing an optical device having a laser diode, which method is suitable for mass production. Another object of the present invention is to provide an optical device having a laser diode which allows accurate property evaluations thereof with small measurement errors.

In a first aspect of the present invention, there is provided a method for manufacturing an optical device, wherein the method comprises:

an etching process of etching a semiconductor lamination unit to form a mesa structure having a resonator end face, thereby forming a laser diode; and a reflecting layer forming process of forming a light reflecting layer such that the light reflecting layer covers entire side surfaces of the mesa structure, wherein the semiconductor lamination unit has a n-type clad layer formed on a substrate and including a nitride semiconductor layer having n-type conductivity, a light-emitting layer formed on the n-type clad layer and including at least one quantum well, and a p-type clad layer formed on the light-emitting layer and including a nitride semiconductor layer having p-type conductivity.

In a second aspect of the present invention, there is provided an optical device having a laser diode, wherein the laser diode comprises:

a substrate;

a n-type clad layer formed on the substrate and including a nitride semiconductor layer having n-type conductivity;

a light-emitting layer formed on the n-type clad layer and including at least one quantum well; and a p-type clad layer formed on the light-emitting layer and including a nitride semiconductor layer having p-type conductivity, wherein at least a portion of the n-type clad layer, the light-emitting layer and the p-type clad layer constitute a mesa structure having a resonator end face, and entire side surfaces of the mesa structure are covered with a light reflecting layer.

In the present disclosure, for example, the expression of "a n-type clad layer formed on a substrate and including a nitride semiconductor layer having n-type conductivity", which expression basically represents formation of a n-type clad layer on a substrate, also includes a case where another layer further exists between the substrate and the n-type clad layer. Similar interpretations regarding the term "formed on . . . " described above should apply to relationships between two adjacent layers of other types.

The summary of the invention described above does not comprehensively cover all features of the invention. Further, any of sub-combinations of those features can also constitute the invention.

According to the present invention, it is possible to provide a method for manufacturing an optical device having a laser diode, which method is suitable for mass production. Further, it is possible to provide an optical device having a laser diode which allows accurate property evaluations thereof with small measurement errors.

DETAILED DESCRIPTION

Hereinafter, the present invention will be described by embodiments thereof, which embodiments by no means restrict the invention defined by the following claims. It should be understood that not all of the combinations of features described in the embodiments are essentially required in order to overcome the problems to be solved by the invention.

<Method for Manufacturing an Optical Device>

A method for manufacturing an optical device of an embodiment includes:

an etching process of etching a semiconductor lamination unit to form a mesa structure having a resonator end face, thereby forming a laser diode; and a reflecting layer forming process of forming a light reflecting layer such that the light reflecting layer covers entire side surfaces including the resonator end faces of the mesa structure, wherein the semiconductor lamination unit has a n-type clad layer formed on a substrate and including a nitride semiconductor layer having n-type conductivity, a light-emitting layer formed on the n-type clad layer and including at least one quantum well, and a p-type clad layer formed on the light-emitting layer and including a nitride semiconductor layer having p-type conductivity.

The aforementioned method, by including the process of forming a light reflecting layer such that the light reflecting layer covers entire side surfaces including resonator end faces of a mesa structure of a laser diode, eliminates the problem that minutely divided laser bars must be handled, thereby successfully rendering the method suitable for mass production.

In the present disclosure, "to cover entire side surfaces" means that, when an object (a light reflecting layer in this case) is orthogonally projected onto each side surface corresponding thereto, the substantially entire portion of the side surface is covered with the image of the object thus orthogonally projected. Another layer may exist between the light reflecting layer and the respective side surfaces. However, provision of the light reflecting layer directly on the respective side surfaces may be preferable in some cases in terms of ensuring accurate property evaluations and reducing measurement errors.

A "resonator end face" represents a face which functions as a main laser beam emitting face and specifically a cross section of a semiconductor lamination unit including at least a light-emitting layer. A resonator end face as a main laser beam emitting face is generally an end face including a light-emitting layer on a short side of a mesa structure in a plan view seen from the top.

<<Etching Process>>

Figure 1C:
FIGS. 1A-1C are schematic drawings showing an etching process of a method for manufacturing an optical device according to an embodiment of the present disclosure.
Figure 1C:
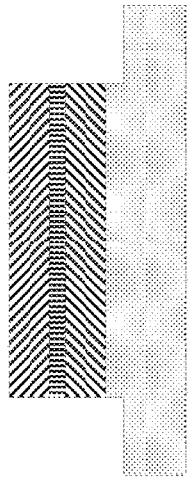
Figure 1B:
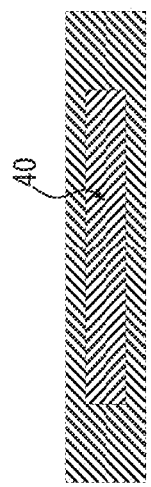
Figure 1B:
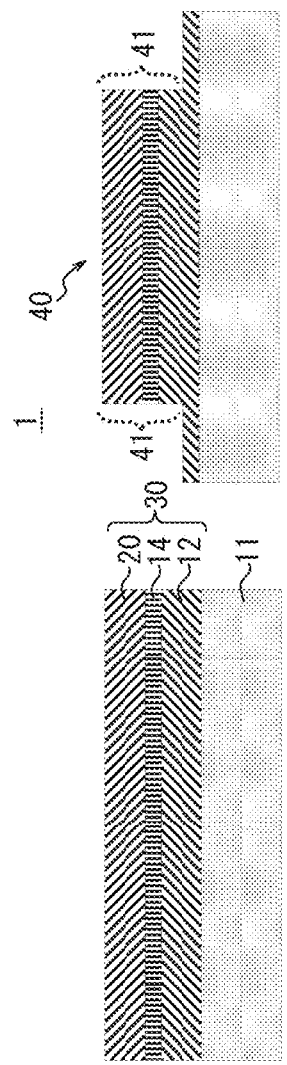
Figure 1A:

FIGS. 1A-1C are schematic drawings showing an etching process. In the etching process, a semiconductor lamination unit 30 having: a n-type clad layer 12 formed on a substrate 11 and including a nitride semiconductor layer having n-type conductivity; a light-emitting layer 14 formed on the n-type clad layer 12 and including at least one quantum well; and a p-type clad layer 20 formed on the light-emitting layer 14 and including a nitride semiconductor layer having p-type conductivity, is etched such that a mesa structure 40 having resonator end faces 41 is formed. Then, the etching depth of the mesa structure 40 may be increased by an additional etching process. For example, each laser beam emitting side (each resonator end face side) of the mesa structure 40 may further be etched, as shown in FIG. 1C, so that an influence caused by the emitted laser beam which spreads in the longitudinal direction (the direction orthogonal to the substrate surface) and is reflected at the bottom surface, is reduced. The etching may reach the substrate 11 in this regard.

It is preferable that dry etching and wet etching are applied in this order in terms of forming resonator end faces substantially orthogonal to the substrate plane, although applications are not particularly restricted thereto.

In a case where the substrate is an AlN substrate and the semiconductor lamination unit includes AlGaN, it is possible to expose as a resonator end face the (1-100) plane of an AlGaN layer, which plane is substantially orthogonal to the (0001) plane of the AlN substrate, by carrying out any appropriate dry etching and then wet etching by using tetramethylammonium hydroxide as an etching solution. Examples of the dry etching include inductively coupled plasma reactive ion etching (ICP-RIE) by using $SiO_2$ as a mask in a $Cl_2$ and $BCl_3$ atmosphere. The more orthogonal to a substrate a resonator end face is, the higher reflectance the resonator end face can achieve. The details will be discussed in Examples.

<<Reflecting Layer Forming Process>>

Figure 2A:
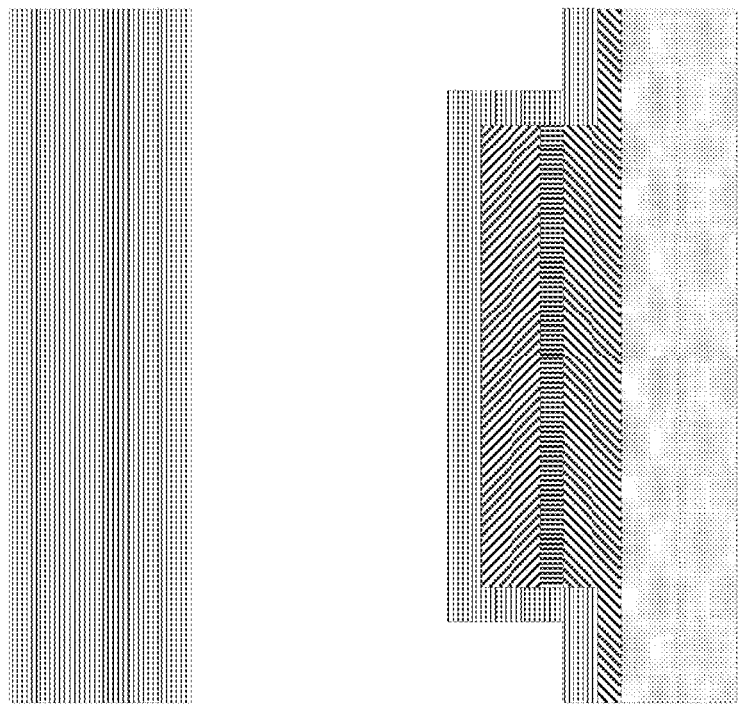
FIGS. 2A-2B are schematic drawings showing a reflecting layer forming process of a method for manufacturing an optical device (and the optical device thus manufactured) according to an embodiment of the present disclosure.
Figure 2B:
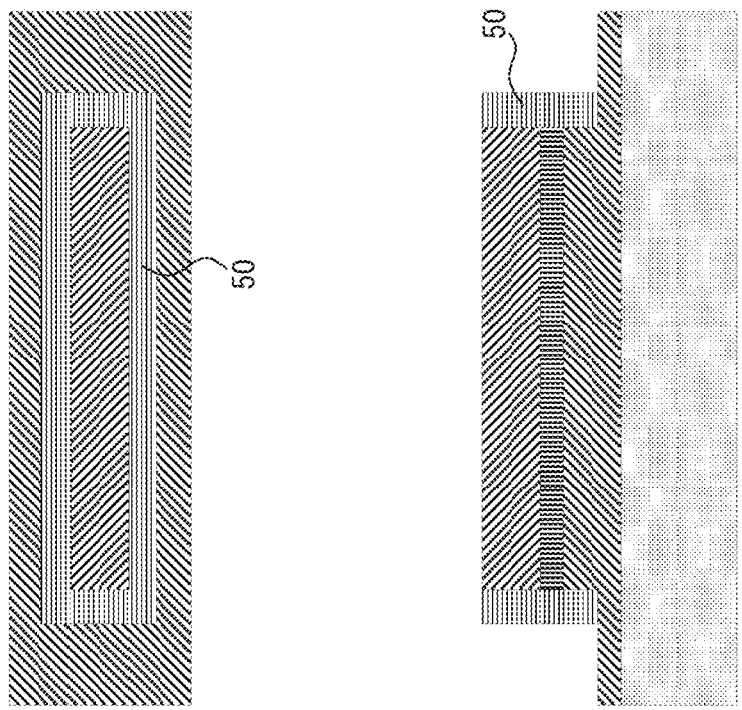

FIGS. 2A-2B are schematic drawings showing a reflecting layer forming process. In the reflecting layer forming process, a light reflecting layer 50 is formed such that the light reflecting layer covers entire side surfaces of the mesa structure 40 of the laser diode. The light reflecting layer 50 may be formed to cover either only the entire side surfaces of the mesa structure 40 as shown in FIG. 2A or both the entire side surfaces and at least a part of the top surface of the mesa structure 40 as shown in FIG. 2B.

Although type of a method for forming the light reflecting layer is not particularly restricted, atomic layer deposition is preferable as a deposition method in terms of improving step coverage. "Atomic layer deposition" represents a film forming method in which a film is generated on a substrate surface by exposing the substrate surface to a plurality of vapor phase raw materials (precursors) in turn. In atomic layer deposition, unlike CVD, precursors of different types are not simultaneously charged in a reaction chamber but introduced/purged in turn in a pulse by independent steps, respectively. The precursor molecules react in a self-controlled manner at a substrate surface at each pulse and the reaction is completed when no adsorbable sites remain at the substrate surface. Accordingly, the maximum amount of film formation in one cycle is determined by how the precursor molecules are chemically coupled with molecules at the substrate surface, i.e. coupling properties of the relevant molecules. Therefore, highly precise and uniform film formation can be achieved on a substrate of any structure and size by controlling film forming conditions such as a sequence in a pulse cycle, temperature of a reaction layer, types of raw materials, and the like. For example, an ALD device manufactured by Veeco/CNT can be used.

In case where a multilayer structure of a hafnium oxide and an aluminum oxide described below is employed, TDMAH (tetrakis(dimethylamino)hafnium) can be used as a vapor phase raw material of the hafnium oxide and TMA (trimethylaluminum) can be used as a vapor phase raw material of the aluminum oxide.

<<Insulating Layer Forming Process and Electrode Portion Forming Process>>

The method for manufacturing an optical device according to the present embodiment may further include between the etching process and the reflecting layer forming process: an electrode portion forming process of forming a p electrode portion electrically connected with the p-type clad layer of the laser diode; and an insulating layer forming process of forming an insulating layer such that the insulating layer covers the p electrode portion.

It is possible to improve an efficiency when electric power is applied to the optical device, by further including the electrode portion forming process and the insulating layer forming process. The insulating layer may be formed such that the insulating layer covers at least a part of the top surface of the mesa structure of a photodetector described below.

Further, the insulating layer may be formed such that the insulating layer covers at least a part of the side surfaces of the mesa structure.

Yet further, the p electrode portion may be electrically connected with the p-type clad layer either directly or by way of another layer (for example, a contact layer) therebetween.

Examples of a material for forming the insulating layer include, without limitation, a metal oxide, a metal nitride and the like containing silicon, boron, hafnium, titanium, aluminum or the like.

<<Photodetector Forming Process>>

It is preferable that the method for manufacturing an optical device according to the present embodiment further includes a photodetector forming process of forming a photodetector having a mesa structure and capable of receiving and detecting light emitted from a resonator end face and that the light reflecting layer is formed on entire side surfaces of the mesa structure of the photodetector, as well, in the reflecting layer forming process.

Providing the substrate of the laser diode with a photodetector, as well, makes it possible to detect light emitted from the laser diode by the photodetector. The details in this regard will be described below. An influence caused by stray light (light emitted from portions other than the resonator end faces) as noise in the detection can be reduced because the light reflecting layer is formed on the entire side surfaces of the respective mesa structures of the laser diode and the photodetector in the present embodiment.

It is also preferable that the etching process of the laser diode includes the photodetector forming process, that is, the mesa structure of the laser diode and the mesa structure of the photodetector are formed in the same process. This makes it possible to provide the same substrate with the photodetector, as well as the laser diode, without necessitating any additional process.

It is preferable that the laser diode and the photodetector are formed adjacent to each other in terms of successfully detecting light emitted from the laser diode in a highly sensitive manner. Specifically, it is preferable that the laser diode and the photodetector are formed such that one of the resonator end faces of each laser diode faces a light-receiving surface of the corresponding photodetector.

It is preferable that the substrate has a wafer-like configuration and the mesa structure of the laser diode and the mesa structure of the photodetector are formed on the wafer-like substrate, respectively, and it is more preferable that a plurality of the mesa structures of the laser diodes and a plurality of the mesa structures of the photodetectors are formed, respectively, in terms of improving mass productivity. Forming the laser diode and the photodetector on the same substrate makes it possible to reduce misalignment between the laser diode and the photodetector to the error level in mesa pattern formation by a manufacturing machine, thereby allowing efficient coupling of the emitted laser beam with the photodetector.

<<Dicing Process>>

The method for manufacturing an optical device according to the present embodiment may further include, after the reflecting layer forming process, a dicing process of individualizing/separating the laser diodes each having a mesa structure with resonator end faces into laser diode chips. As a result, laser diode chips each having reflecting layers at resonator end faces thereof can be easily manufactured without necessitating a conventional process of providing respective resonator end faces of laser bars (i.e. individualized laser diodes) with reflecting layers by coating, of which handling is troublesome. Further, productivity improves dramatically because laser diode chips, each of which includes a photodetector provided on the substrate thereof, can be formed by the same one dicing process.

Next, an optical device of the present embodiment will be described.

(Optical Device)

As shown in FIGS. 2A-2B, an optical device of the present embodiment is provided with a laser diode 1 having: a substrate 11; a n-type clad layer 12 formed on the substrate 11 and including a nitride semiconductor layer having n-type conductivity; a light-emitting layer 14 formed on the n-type clad layer 12 and including at least one quantum well; and a p-type clad layer 20 formed on the light-emitting layer 14 and including a nitride semiconductor layer having p-type conductivity, wherein at least a portion of the n-type clad layer, the light-emitting layer and the p-type clad layer constitute a mesa structure 40 having resonator end faces 41, and entire side surfaces including the resonator end faces 41 of the mesa structure 40 of the laser diode are covered with a light reflecting layer 50.

The expression that "entire side surfaces including the resonator end faces of the mesa structure are covered with a light reflecting layer" may represent either a state in which the light reflecting layer is formed directly on the entire side surfaces of the mesa structure such that the light reflecting layer directly covers the entire side surfaces or a state in which the light reflecting layer indirectly covers the entire side surfaces of the mesa structure by way of another layer between the light reflecting layer and the entire side surfaces. In short, it suffices that the light reflecting layer entirely covers each side surface of the mesa structure in a plan view seen from the direction orthogonal to the side surface.

Figure 3A:
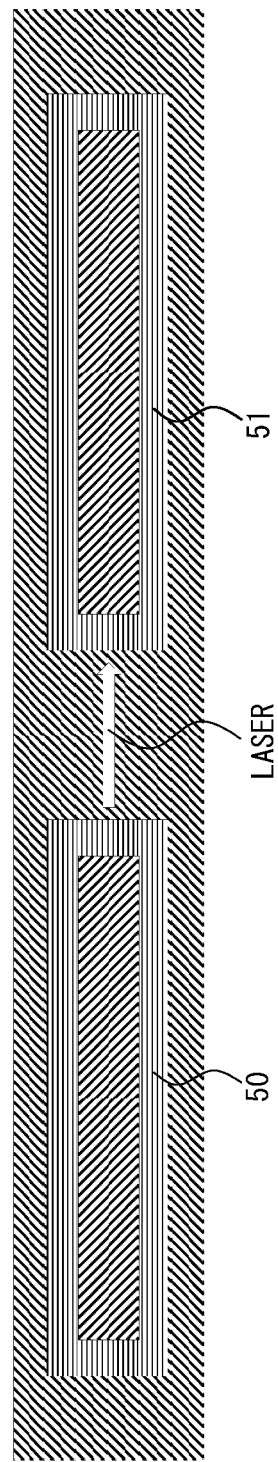
FIGS. 3A-3B are schematic drawings showing an optical device provided with a photodetector according to an embodiment of the present disclosure.
Figure 3B:
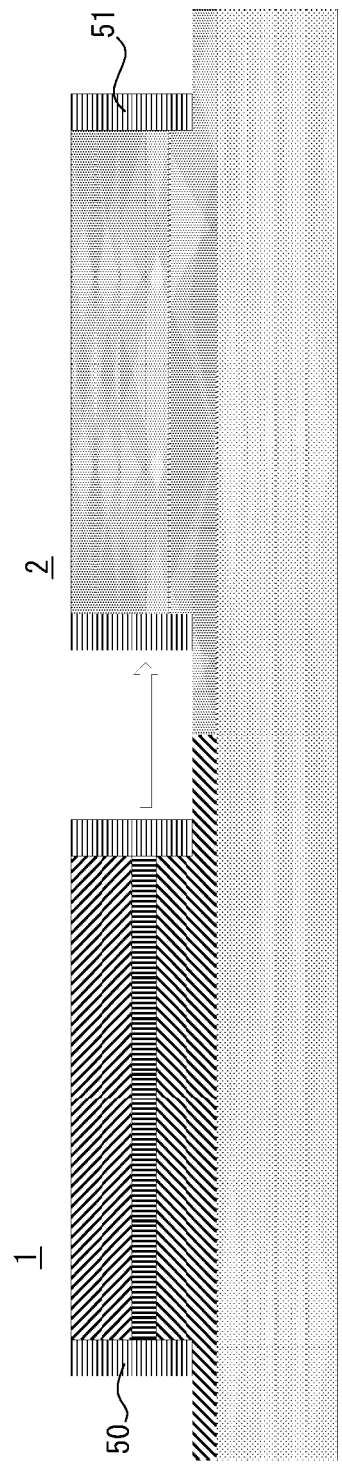

As shown in FIGS. 3A-3B, the optical device of the present embodiment may further be provided with a photodetector 2 having a mesa structure and capable of receiving and detecting light emitted from the laser diode 1. Side surfaces of the mesa structure of the photodetector 2 may be covered with a light reflecting layer 51. The light reflecting layer 51 may be formed either in the same manner as or in a manner different from the light reflecting layer 50. The light reflecting layer 51 is preferably formed in the same manner as the light reflecting layer 50 in terms of realizing highly precise property evaluations of the laser diode. The layer structures of the photodetector 2 may be either the same as or different from the layer structures of the laser diode. A laser beam receiving face of the photodetector is preferably positioned to be opposed to a main laser beam emitting face, i.e. a resonator end face, of the laser diode. Properties of the laser diode can be evaluated in a simple, easy and highly precise manner because side surfaces of the laser diode and the photodetector are covered with the light reflecting layer. Forming the laser diode and the photodetector on the same one substrate makes it possible to reduce misalignment between the laser diode and the photodetector to the error level in mesa pattern formation by a manufacturing machine, thereby allowing highly precise property evaluations. Further, in a case where the laser diode and the photodetector share the same layer structures as described above, a height of the laser beam emitting face and a height of the laser beam receiving face are substantially the same, whereby properties of the laser diode can be evaluated in a further more precise manner.

The optical device of the present embodiment may further be provided with a control unit for controlling the laser diode and the photodetector.

The optical device of the present embodiment may have a plurality of laser diodes. The optical device of the present embodiment may have a plurality of photodetectors. The substrate of the optical device of the present embodiment may have a wafer-like configuration. In a case where the optical device of the present embodiment has a plurality of laser diodes and/or photodetectors, a wafer-like configuration of the substrate contributes to improving production efficiency.

In a case where the optical device of the present embodiment has the photodetector 2, it is acceptable to eliminate the light reflecting layers 50, 51 in the embodiment. In this case, it is preferable that the laser diode 1 and the photodetector 2 are formed on the same one substrate and it is more preferable that the laser diode 1 and the photodetector 2 share the same layer structures in terms of improving detection accuracy. When the laser diode 1 and the photodetector 2 share the same layer structure, a resonator end face of the laser diode and an end face of a laser beam receiving layer of the photodetector share the same height, whereby the photodetector can receive laser beam in highly efficient manner and detection accuracy further improves. The smaller a distance between a resonator end face of the laser diode and a laser beam receiving layer of the photodetector is, the more preferable. The distance between a resonator end face of the laser diode and a laser beam receiving layer of the photodetector is preferably ≤50 µm, more preferably ≤20 µm, and further more preferably ≤5 µm. Setting a distance between a resonator end face of the laser diode and a laser beam receiving layer of the photodetector to be within the aforementioned ranges is generally difficult in the conventional manufacturing process, whereby measurement accuracy inevitably deteriorates due to an influence of positional misalignment or the like. However, it is possible to realize an optical device having a laser diode and a photodetector both provided in a highly precise manner without necessitating complicated processes by making the laser diode and the photodetector share the same layer structure on the same substrate.

(Light Reflecting Layer)

The light reflecting layer is preferably a dielectric lamination film in terms of designing a light reflecting layer exhibiting a high light reflectance with respect to a desired wavelength. A lamination of two or more different materials suffices for the dielectric lamination film. Regarding a lamination cycle, ≥1 cycle suffices. For example, the lamination cycle is 1.5 cycle when the light reflecting layer is constituted of three layers including first material/second material/first material.

A material for the light reflecting layer is preferably oxide or fluoride or nitride of at least one selected from the group consisting of aluminum, hafnium, silicon, titanium, zirconium, lead, magnesium and gallium. The aforementioned dielectric lamination film may be realized by combining two or more oxides as described above.

Type of the light reflecting layer is not particularly restricted as long as a light reflectance thereof is larger than zero. The light reflectance is preferably 30%, more preferably 50%, and further more preferably 70%.

(Laser Diode)

The laser diode in the optical device of the present embodiment has a semiconductor lamination unit including: a substrate; a n-type clad layer formed on the substrate and including a nitride semiconductor layer having n-type conductivity; a light-emitting layer formed on the n-type clad layer and including at least one quantum well; and a p-type clad layer formed on the light-emitting layer and including a nitride semiconductor layer having p-type conductivity. A portion of the n-type clad layer, the light-emitting layer and the p-type clad layer constitute a mesa structure having resonator end faces. Entire side surfaces including the resonator end faces of the mesa structure are covered with a light reflecting layer.

A resonator is a part in which light is confined between light reflecting surfaces facing each other, so that standing waves of light are formed. A resonator end face represents such a light reflecting surface as described above. A cleavage plane of crystal can be used as a resonator end face, although a resonator end face is not particularly limited thereto. For example, the (1-100) plane of AlGaN can be used as a resonator end face when a resonator is an AlGaN layer. It is preferable that a resonator end face is provided such that an angle formed between the resonator end face and a substrate plane is substantially 90°. Specifically, the angle formed between a resonator end face and a substrate plane is preferably in the range of 60° to 120°, more preferably in the range of 80° to 100°, further more preferably in the range of 85° to 95°, and yet further more preferably in the range of 87.5° to 92.5°, A mesa structure is a structure including a region of which configuration decreases its width upward in a cross section thereof and a cross-sectional configuration of the structure is quadrilateral (typically, trapezoidal). In other words, a mesa structure includes a region having in a cross section thereof a lower side corresponding to the bottom plane of the region and an upper side substantially in parallel to the lower side. In general, a remaining region not having been etched when a semiconductor lamination unit has been partly etched constitutes a mesa structure.

Figure 4:
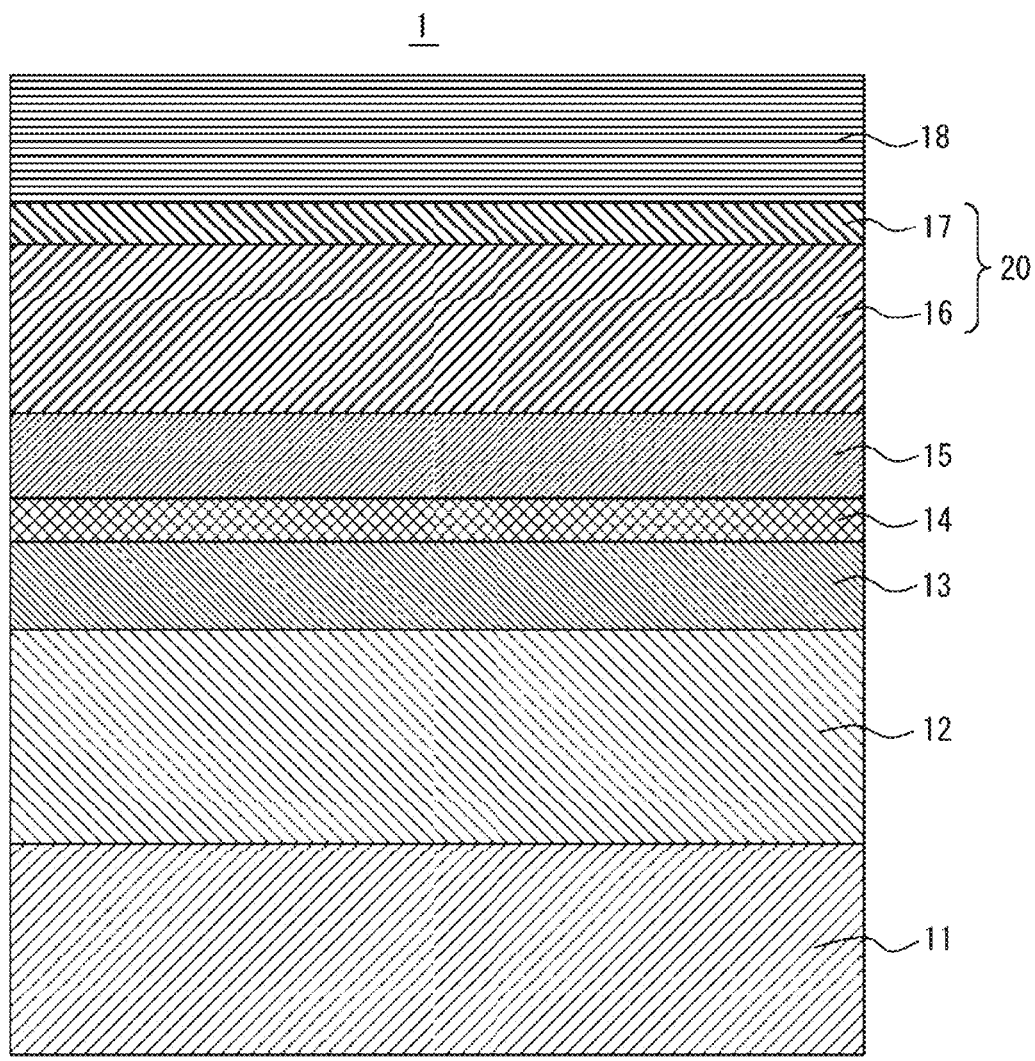
FIG. 4 is a schematic view of a semiconductor lamination unit in an optical device according to an embodiment of the present disclosure.

Next, the semiconductor lamination unit and the respective structural requirements thereof will be described with reference to FIG. 4.

(Semiconductor Lamination Unit)

The semiconductor lamination unit has: the n-type clad layer 12 formed on the substrate 11 and including a nitride semiconductor layer having n-type conductivity; the light-emitting layer 14 formed on the n-type clad layer 12 and including at least one quantum well; and the p-type clad layer 20 formed on the light-emitting layer 14 and including a nitride semiconductor layer having p-type conductivity.

The semiconductor lamination unit may further have a p-type longitudinally conductive layer 16, a p-type transversely conductive layer 17, a n-side waveguide layer 13, a p-side waveguide layer 15, a p-type contact layer 18, and an electrode portion (not shown).

(Substrate)

It is preferable that the substrate 11 has a low basal plane dislocation density and allows the semiconductor lamination unit to grow on the upper surface thereof. In one of the embodiments which can maximize an effect of the present invention, the laser diode 1 includes layers of good quality having basal plane dislocation density of $5 \times 10^4$ cm$^{-2}$ or lower. In crystal having basal plane dislocation density of $5 \times 10^4$ cm$^{-2}$ or lower, in particular, scattering of carriers due to dislocation is reduced and resistivity in the longitudinal direction decreases, whereby a ratio of resistivity in the longitudinal direction and resistivity in the transverse direction tends to be small. Accordingly, the substrate 11 is required to have a defect density further lower than the defect density described above (for example, $1 \times 10^3$ to $1 \times 10^4$ cm$^{-2}$). Among various types of the substrate 11, for example, the substrate 11 of AlN single crystal is preferable (without limitation thereto) because $Al_xGa_{1-x}N$ mixed crystal having defect density of $1 \times 10^4$ cm$^{-2}$ or lower can be obtained thereon. Through dislocation density of the substrate 11 can be measured, for example, by etching with KOH-NaOH eutectic for 5 minutes at 450° C. and then using etch pit density measurement.

The substrate 11 contains/is substantially constituted of/is essentially constituted of different materials (such as SiC, Si, MgO, Ga$_2$O$_3$, Alumina, ZnO, GaN, InN, and/or sapphire) and an $Al_uGa_{1-u}N$ material ($0 \leq u \leq 1.0$) may be formed on the substrate by, for example, epitaxial growth. The materials described above are substantially fully lattice-relaxed and may have at least 1 μm thickness, for example. The substrate 11 may be covered with a homoepitaxial layer containing/ substantially constituted of/essentially constituted of the same material existing inside/on the substrate 11 such as AlN.

Other than N, impurities including H, C, O, F, Mg, Si or a group V element other than N such as P, As, Sb (impurity elements are not limited thereto) may be mixed into the substrate 11 in order to obtain conductivity or for other purposes.

The laser diode 1 can be formed preferably on the (0001) plane or a plane inclined at a small inclination angle with respect to the (0001) plane normal direction, without limitation thereto. The inclination angle is set to be, for example, in the range of −4° to 4° and preferably in the range of −0.4° to 0.4°.

Various layers of the multilayer structure disposed on the substrate 11 can be formed by any of a variety of different techniques including: deposition such as metal organic chemical vapor deposition (MOCVD), halide vapor phase epitaxy (HVPE); epitaxial growth technique such as molecular beam epitaxy (MBE); and the like.

(P-Type Clad Layer)

The p-type clad layer 20 includes a nitride semiconductor layer having p-type conductivity. It is preferable that the p-type clad layer 20 is fully strained with respect to the substrate 11. A laser diode 1 layer formed to be fully strained with respect to the substrate maximizes the effect of the present invention because the layer can suppress an increase in through dislocation density. In the present disclosure, the expression that a layer of the multilayer structure is "fully strained with respect to the substrate 11" means that the layer has very small strain relaxation or a lattice relaxation rate of 5% with respect to the substrate 11. A lattice relation rate can be determined from: reciprocal lattice coordinates of a diffraction peak of an asymmetric plane from which satisfactory diffraction intensity can be obtained through X-ray diffraction measurement (for example, any of asymmetric planes such as the (105) plane, the (114) plane or the (205) plane); and reciprocal lattice coordinates of a diffraction peak of the substrate 11.

In a case where the p-type longitudinally conductive layer 16 and the p-type transversely conductive layer 17 exist, the two layers collectively constitute the p-type clad layer.

(p-Type Longitudinally Conductive Layer)

The p-type longitudinally conductive layer 16 is a layer provided for obtaining p-type conductivity and composed of $Al_sGa_{1-s}N$ having a graded Al composition "s" which decreases in the direction away from the top surface of the substrate 11. In short, the p-type longitudinally conductive layer 16 as a constituent of the p-type clad layer has a compositional gradient. A range of film thickness and a range of the Al composition "s" of the p-type longitudinally conductive layer 16 as a material of a bandgap not absorbing light having a desired emission wavelength may be limited in order to increase an overlap of electric field intensity distribution of an optical standing wave mode and the light-emitting layer 14 inside the device (that is, to increase light confinement). In a case where the emission wavelength of the light-emitting layer 14 is in the range of ≥210 nm and ≤300 nm, a layer composed of $Al_sGa_{1-s}N$ having a graded Al composition "s" which decreases in the direction away from the top surface of the substrate 11 within the range of, e.g., $0.3 \leq s \leq 1.0$, has film thickness preferably in the range of ≥250 nm and ≤450 nm, more preferably in the range of ≥300 nm and ≤400 nm. It is possible to reduce internal loss in the laser diode 1 by controlling the film thickness of the p-type longitudinally conductive layer 16.

The internal loss in the laser diode 1 can be measured by, for example, the known method such as Variable Stripe Length Method (VSLM).

A quantity of change in the Al composition of the p-type longitudinally conductive layer 16 with respect to film thickness thereof need not be constant. The quantity of change in the Al composition may either gradually or stepwisely decrease in the direction approaching the light-emitting layer 14 in order to increase light confinement or for other purposes.

It is preferable that impurities such as H, Mg, Be, Zn, Si, B are not intentionally mixed into the p-type longitudinally conductive layer 16 in a region thereof close to the p-side waveguide layer 15, that is, the p-type longitudinally conductive layer 16 is undoped in the aforementioned region in order to suppress diffusion of impurities. In the present disclosure, the term "undoped" means that the impurity elements described above are not intentionally mixed into a layer on the issue in a formation process thereof. When impurity elements derived from a raw material and/or a manufacturing apparatus are mixed into the layer in the range of ≤10$^{16}$ cm$^{-3}$, those impurities are not regarded as "being intentionally mixed". Amounts of elements mixed into the p-type longitudinally conductive layer can be determined by a technique such as secondary ion mass spectrometry. The term "undoped" represents substantially the same meaning as described above throughout the present application. The region to be undoped, of the p-type longitudinally conductive layer 16, includes at least the interface with the p-side waveguide layer 15 thereof but the size of the region is not limited. For example, the entire region of the p-type longitudinally conductive layer 16 may be undoped. In another example, a 50% region of the p-type longitudinally conductive layer 16, which region is closer to the p-side waveguide layer 15 than the p-type transversely conductive layer 17, may be undoped. In yet another example, a region of approximately 10% which is close or adjacent to the p-side waveguide layer 15, of the p-type longitudinally conductive layer 16, may be undoped.

An intermediate layer composed of $Al_vGa_{1-v}N$ ($0<v\leq1.0$) having an Al composition "v" which increases in the direction away from the top surface of the substrate 11 may be provided between the p-type longitudinally conductive layer 16 and the p-side waveguide layer 15 so that conductivity improves and/or the p-type transversely conductive layer 17 and the p-type contact layer 18 are formed in a fully strained manner, respectively. The intermediate layer between the p-type longitudinally conductive layer 16 and the p-side waveguide layer 15 may be mixed crystal which does not have a bandgap not absorbing light having a desired emission length. The intermediate layer preferably has film thickness of ≤50 nm and may be undoped.

Resistivity in the longitudinal direction of the p-type longitudinally conductive layer 16 can be calculated by, for example, using resistance Rs' obtained by subtracting resistance Rn attributed to the n-type clad layer 12 from series resistance Rs of the laser diode 1 of the present embodiment (Rs'=Rs−Rn). Resistivity in the longitudinal direction of the p-type clad layer 20 is calculated from film thickness T of the p-type clad layer 20 and an area A of a p-type electrode in contact with the p-type contact layer 18 of the laser diode 1 as Rs'×A/T. Resistance R of the n-type clad layer 12 can be determined by, for example, transmission line measurement and non-contact resistance measurement by Eddy-current.

(p-Type Transversely Conductive Layer)

The p-type transversely conductive layer 17 may have a thin film thickness so that quantum transmission of carriers through the p-type transversely conductive layer 17 is facilitated. For example, film thickness of the p-type transversely conductive layer 17 may be ≤20 nm or ≤10 nm and is preferably ≤5 nm.

Impurities such as H, Mg, Be, Zn, Si, B may be intentionally mixed into the p-type transversely conductive layer 17 in order to control resistivity in the longitudinal direction of the p-type transversely conductive layer 17. An amount of impurities to be mixed is set in accordance with a net magnitude of the electric field dielectrically induced/accumulated at a surface and inside of the p-type transversely conductive layer 17 and may be in one example in the range of $\geq1\times10^{19}$ cm$^{-3}$ and $\leq5\times10^{21}$ cm$^{-3}$.

An Al composition of the p-type transversely conductive layer 17 at the interface thereof with the p-type contact layer 18 is preferably in the range of ≥0.9 and ≤1.0. It is preferable that the p-type transversely conductive layer 17 is fully strained with respect to the substrate 11. The p-type transversely conductive layer 17 as described above causes an effect of improving transverse conductivity because a net internal electric field accumulated at a surface and an inner portion in the vicinity of the surface of the p-type transversely conductive layer 17 is negatively charged and positive holes are dielectrically accumulated. A distribution of the Al composition of the p-type transversely conductive layer 17 in the region of the laser diode 1 is preferably restricted to equal to or less than 5%. The p-type transversely conductive layer 17 satisfying the aforementioned condition can realize high transverse conductivity because scattering of carriers due to the compositional distribution is reduced.

The p-type transversely conductive layer 17 is preferably formed to be composed of $Al_tGa_{1-t}N$ of which Al composition "t" is in the range of $0.9\leq t\leq1.0$ by retaining $Al_yGa_{1-y}N$ having an Al composition "y" smaller than the Al composition "t" of the finalized p-type transversely conductive layer 17 in a high temperature state in which no Al and Ga raw materials are supplied.

(n-Type Clad Layer)

The n-type clad layer 12 includes a nitride semiconductor layer having n-type conductivity. The n-type clad layer 12 is preferably formed to be fully strained with respect to the substrate 11. An intermediate layer of which Al composition uniformly changes may exist at the interface between the n-type clad layer 12 and the substrate 11 and an Al composition and film thickness of the n-type clad layer 12 may be restricted so that the n-type clad layer 12 is formed to be fully strained with respect to the substrate 11. The Al composition of the n-type clad layer 12 may be restricted so that low contact resistance (for example, $1\times10^{-6}$ Ωcm$^2$ to $1\times10^{-4}$ Ωcm$^2$) is obtained with respect to an appropriate electrode. In an embodiment of the n-type clad layer 12 considering the aforementioned restrictions, the n-type clad layer 12 may have an Al composition in the range of 0.6 to 0.8 and film thickness in the range of 0.3 μm to 0.5 μm.

The n-type clad layer 12 may have a compositionally graded layer in which an Al composition increases in the direction away from the substrate 11 in order to control the longitudinal conductivity thereof. In this case, provided that the Al composition of the n-type clad layer 12 is determined as the average of Al compositions at respective positions in the film thickness direction over the entire film thickness of the n-type clad layer 12, the Al composition may have the same embodiment as described above in terms of limitation thereto.

Other than N, impurities including H, C, O, F, Mg, Ge, Si or a group V element other than N such as P, As, Sb (impurity elements are not limited thereto) may be mixed into the n-type clad layer 12 in order to control longitudinal conductivity thereof. An appropriate amount of impurities to be mixed is restricted in accordance with the Al composition of the n-type clad layer 12 and preferably in the range of $\geq1\times10^{19}$ cm$^{-3}$ and $\leq1\times10^{20}$ cm$^{-3}$.

(Waveguide Layer)

The waveguide layer is a nitride semiconductor containing Al, Ga having a bandgap not absorbing light of a desired emission wavelength and an Al composition and film thickness thereof may be restricted so that an overlap of electric field strength distribution of standing light and the light-emitting layer 14 in the device is increased. For example, the waveguide layer preferably has an Al composition in the range of 0.55 to 0.65 and film thickness in the range of 70 nm to 150 nm for the light-emitting layer 14 of 260 nm to 280 nm.

The waveguide layer may be constituted of two layers, i.e. a layer on the side of the n-type clad layer 12 with respect to the light-emitting layer 14 (the n-side waveguide layer 13) and a layer on the side of the p-type clad layer 20 with respect to the light-emitting layer 14 (the p-side waveguide layer 15). That is, the n-side waveguide layer 13 may be formed between the n-type clad layer 12 and the light-emitting layer 14, and the p-side waveguide layer 15 may be formed between the p-type clad layer 20 and the light-emitting layer 14. A ratio of film thickness of the n-side waveguide layer 13 and the p-side waveguide layer 15 can be changed in various manners in accordance with embodiments of light confinement in the light-emitting layer 14 and the Al compositions of the n-type clad layer 12 and the p-type clad layer 20. It is preferable that Al compositions of the n-side waveguide layer 13 and the p-side waveguide layer 15 are uniform in the film thickness direction, respectively, without limitation thereto. An Al composition of the p-side waveguide layer 15 may have a larger number than an Al composition of the n-side waveguide layer 13 in order to avoid light absorption of metal existing on the p-type contact. For a similar purpose, film thickness of the p-side waveguide layer 15 may be larger than film thickness of the n-side waveguide layer 13. Other than N, impurities including H, C, O, F, Mg, Si or a group V element other than N such as P, As, Sb (impurity elements are not limited thereto) may be mixed into the n-side waveguide layer 13 in order to obtain the same type of conductivity as the n-type clad layer 12.

A compositionally graded layer composed of $Al_wGa_{1-w}N$ of which Al composition "w" decreases in the direction away from the top surface of the substrate 11 may be provided between the n-side waveguide layer 13 and the n-type clad layer 12 in order to enhance longitudinal conductivity or for other purposes. The intermediate layer between the n-side waveguide layer 13 and the n-type clad layer 12 preferably has film thickness of ≤10 nm.

A compositionally graded layer composed of $Al_xGa_{1-x}N$ of which Al composition "x" increases in the direction away from the top surface of the substrate 11 may be provided between the p-side waveguide layer 15 and the p-type clad layer 20 in order to enhance longitudinal conductivity or for other purposes. It is preferable that the intermediate layer between the p-side waveguide layer 15 and the n-type clad layer 20 has satisfactorily thin film thickness (for example, ≤30 nm or ≤20 nm) so that light confinement in the waveguide layer does not deteriorate.

An electron block layer having a bandgap larger than that of the p-side waveguide layer 15 can be provided inside the p-side waveguide layer 15 or between the p-side waveguide layer 15 and the light-emitting layer 14 or between the p-side waveguide layer 15 and the p-type longitudinally conductive layer 16 or in a portion of the p-side waveguide layer 15. The electron block layer can have thickness of ≤30 nm or ≤20 nm or preferably ≥15 nm so that positive holes can quantum-mechanically move through the electron block layer smoothly.

(Light-Emitting Layer)

The light-emitting layer 14 can be a single quantum well or a plurality of quantum wells directly or indirectly interposed between the n-type clad layer and the p-type clad layer. The number of quantum well(s) can be 3 or 2 or 1, depending on the longitudinal conductivities of the n-type clad and the p-type clad.

Elements such as Si, Sb, P may be intentionally mixed into at least a portion of the light-emitting layer 14 by an amount of $1×10^{15}$ cm$^{-3}$ or more in order to decrease an influence of crystal defect of the light-emitting layer 14.

(p-Type Contact Layer)

The p-type contact layer 18 is formed on the p-type clad layer 20 and may be a nitride semiconductor containing GaN. Impurities other than N, including H, B, C, O, F, Mg, Ge, Si or a group V element other than N such as P, As, Sb (impurity elements are not limited thereto) may be mixed into the p-type contact layer 18 in order to decrease contact resistance thereof. For example, Mg may be mixed into the p-type contact layer by an amount in the range of $1×10^{20}$ cm$^{-3}$ to $1×10^{22}$ cm$^{-}$.

Electrical contact with the laser diode 1 can be effected by an electrode portion provided on the p-type contact layer 18 and an electrode portion provided to be in contact with the n-type clad layer 12. An electrode portion can be provided to be in contact with the n-type clad layer 12 by, for example, forming an electrode portion on the back side of the substrate 11 or removing the upper layers of the laser diode 1 by chemical/dry etching so that the n-type clad layer 12 is exposed in at least one region in the vicinity of the p-type contact layer 18 and forming an electrode on the n-type clad layer 12 thus exposed.

(Electrode Portion)

The electrode portion provided on the p-type contact layer 18 may be metal containing at least one element selected from Ni, Pt, Au and Pd.

The electrode portion provided on the n-type clad layer 12 or the back side of the substrate 11 may be metal containing at least one element selected from V, Al, Au, Ti, Ni and Mo. A metal layer in contact with the substrate 11 is preferably metal containing V or Ti.

EXAMPLES

Example 1

An optical device provided with a nitride semiconductor laser diode described below was prepared as Example 1. The laser diode was prepared by MOCVD by using as raw materials trimethylgallium (TMG), triethylgallium (TEG), trimethylaluminum (TMA), ammonium ($NH_3$), silane ($SiH_4$), bis(cyclopentadienyl)magnesium ($Cp_2Mg$), and the like. A homoepitaxial growth layer composed of AlN (0.2 μm) was formed by allowing TMA and $NH_3$ to react with each other in an $H_2$ atmosphere at 1200° C. on a slope inclined at an inclination angle of 0.1° to 0.3° with respect to the (0001) plane of the single crystal AlN substrate 11.

An AlGaN intermediate layer and a n-type clad layer 12 were formed in a laminated manner in this order on the homoepitaxial growth layer composed of AlN by allowing TMA, TMG, $NH_3$ and $SiH_4$ to react with each other in an $H_2$ atmosphere at 1055° C. The AlGaN intermediate layer had film thickness of 30 nm and an Al composition which uniformly decreased in the range of 1.0 to 0.71 in the direction away from the top surface of the substrate 11. The n-type clad layer 12 was composed of $Al_{0.7}Ga_{0.3}N$, had film thickness of 0.35 μm, and was doped with Si by $5×10^{19}$ cm$^{-3}$. The AlN homoepitaxial growth layer, the intermediate layer and the n-type clad layer 12 were formed to be fully strained with respect to the substrate 11 by setting a formation rate thereof to be in the range of 0.3 μm/h to 0.6 μm/h.

A n-side waveguide layer 13 and a light-emitting layer 14 were formed in a laminated manner in this order on the n-type clad layer 12 by allowing TMA, TMG and $NH_3$ to react with each other in an $H_2$ atmosphere at 1055° C. The n-side waveguide layer 13 was composed of $Al_{0.63}Ga_{0.37}N$ and had film thickness of 60 nm. The light-emitting layer 14 was composed of a multilayer quantum well layer having the total film thickness of 30 nm. Si was doped by $3×10^{19}$ cm$^{-3}$ during the formation process of a portion of a barrier layer of the light-emitting layer 14 by introducing $SiH_4$ as a raw material. Further, a p-side waveguide layer 15 composed of $Al_{0.62}Ga_{0.38}N$ and having film thickness of 50 nm was formed on the light-emitting layer 14. The n-side waveguide layer 13, the light-emitting layer 14 and the p-side waveguide layer 15 were formed to be fully strained with respect to the substrate 11 by setting a formation rate thereof at 0.4 μm/h.

An AlGaN intermediate layer having film thickness of 20 nm and an Al composition which uniformly increased in the range of 0.62 to 1.0 in the direction away from the top surface of the substrate 11 and a p-type longitudinally conductive layer 16 having film thickness of 0.32 μm and an Al composition which decreased in the range of 1.0 to 0.3 in the direction away from the top surface of the substrate 11 were formed in a laminated manner in this order on the p-side waveguide layer 15 by allowing TMA, TMG and $NH_3$ to react with each other in an $H_2$ atmosphere at 1055° C. The p-type longitudinally conductive layer 16 was formed to be fully strained with respect to the substrate 11 by setting a formation rate thereof to be in the range of 0.3 μm/h to 0.5 μm/h. The p-type longitudinally conductive layer 16 was undoped in the entire region thereof.

A p-type transversely conductive layer 17 composed of $Al_{0.45}Ga_{0.05}N$ and having film thickness of 3 nm was formed on the p-type longitudinally conductive layer 16. Thereafter, supply of the TMA and TMG raw materials was stopped at 1055° C. and a state in which only $Cp_2Mg$ was supplied was retained for 10 minutes or more (i.e. annealing was effected), so that the p-type transversely conductive layer 17 was modified to an $Al_{0.97}Ga_{0.03}N$ layer doped with Mg ($1 \times 10^{20}$ $cm^{-3}$). The p-type transversely conductive layer 17 was formed to be fully strained with respect to the substrate 11 by modifying the p-type transversely conductive layer 17 by the procedure described above. The p-type longitudinally conductive layer 16 and the p-type transversely conductive layer 17 collectively constitute the p-type clad layer 20 in the present embodiment.

An XRD analysis of the (002) plane revealed that diffusion of the Al composition in the p-type transverse conductive layer 17 was 3.5% in a region corresponding to the region of the laser diode 1. When atomic arrangement of the p-type transversely conductive layer 17 was analyzed at a plurality positions thereof based on transmission images in the <11-20> direction obtained by a transmission electron microscope, it was confirmed that the p-type transversely conductive layer 17 was fully strained with respect to the substrate 11.

A p-type contact layer 18 composed of GaN, having film thickness of 20 nm and doped with Mg ($5 \times 10^{20}$ $cm^{-3}$) was formed on the p-type transversely conductive layer 17 by allowing TMG, $Cp_2Mg$ and $NH_3$ to react with each other in an $H_2$ atmosphere at 940° C.

The nitride semiconductor laser diode 1 thus prepared was subjected to annealing in a $N_2$ atmosphere at 700° C. for at least 10 minutes, so that resistance of the p-type layers was further lowered.

The n-type clad layer 12 was exposed in a rectangular region being in parallel to and elongated in the <1-100> direction by carrying out dry etching using a gas containing C12. Further, a passivation layer containing $SiO_2$ was formed at a surface of the nitride semiconductor laser diode 1.

A plurality of electrode metal regions (p-type electrodes) each containing Ni or Au and having a rectangular configuration which was in parallel to and elongated in the <1-100> direction was formed on the p-type contact layer 18. Further, a plurality of metal electrodes (n-type electrodes) each composed of V, Al, Ni, Ti or Au and having a rectangular configuration which was in parallel to and elongated in the <1-100> direction was formed in the region where the n-type clad layer 12 was exposed.

Figure 5A:
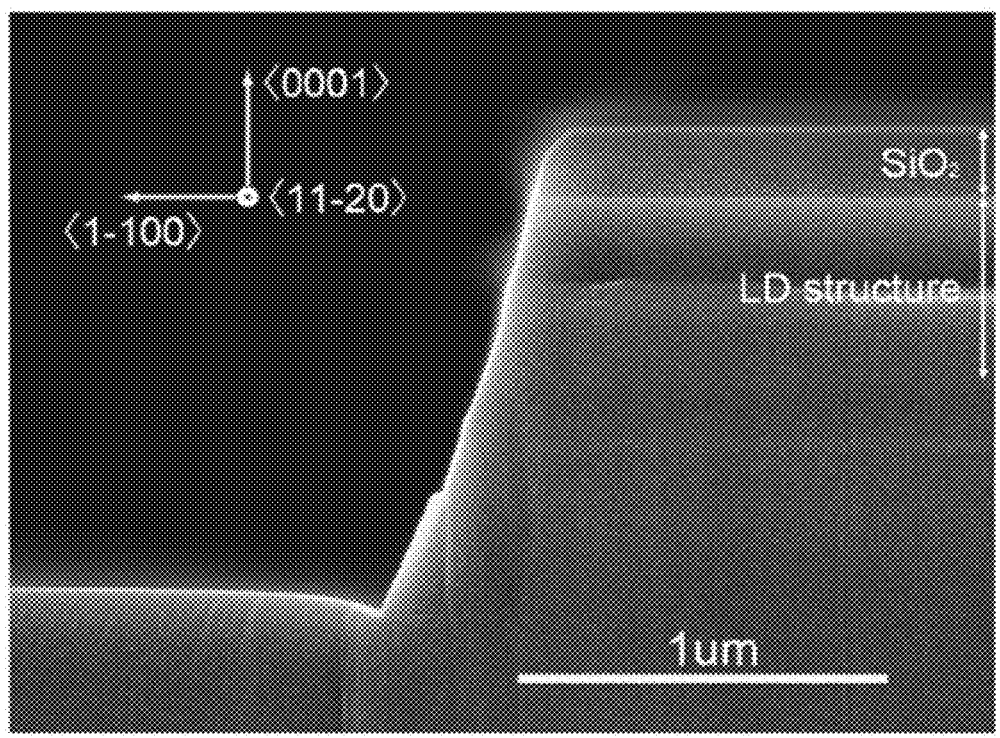
FIGS. 5A-5B are cross-sectional TEM images obtained by observation of side surfaces of a mesa structure in Example 1.

Next, dry etching, starting from the p-type contact layer in the depth direction by 1.2 μm and using $SiO_2$ (500 nm) deposited by PECVD as a mask, was carried out in an atmosphere of $Cl_2$ and $BCl_3$ by using an ICP-RIE equipment (CE-S) manufactured by ULVAC, Inc. Dry etching along the (1-100) plane of the AlGaN layer was carried out, whereby a mesa structure having length: 400 μm and width: 100 μm and including a resonator end face was formed. The resonator end face was inclined at 60° with respect to the (0001) plane of the AlN substrate (FIG. 5A).

Figure 5B:
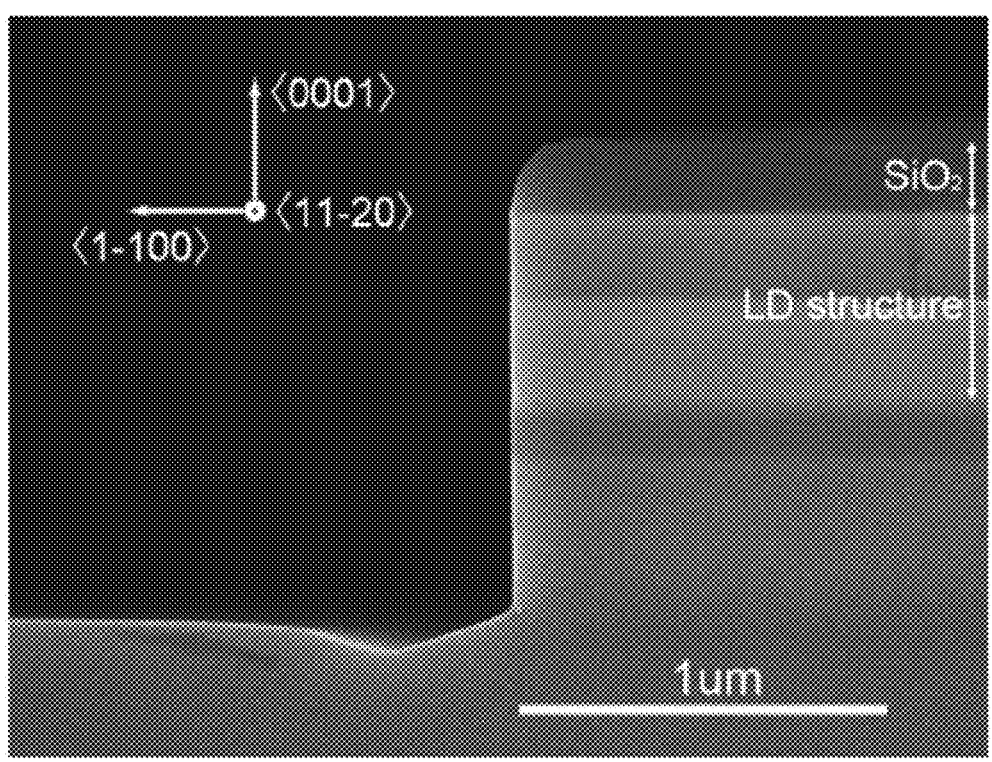

Then, wet etching was carried out by immersing the device in a TMAH (tetramethylammonium hydroxide) solution (concentration: 25%) at 80° C. for 7.5 minutes. As a result, a mirror end face substantially orthogonal (91.5°) to the (0001) plane of the AlN substrate was formed (FIG. 5B).

A light reflecting layer composed of lamination films of hafnium oxide ($HfO_2$) and aluminum oxide ($Al_2O_3$) was formed by atomic layer deposition using an ALD device (Fiji G2) manufactured by Veeco/CNT. The lamination films had a structure in which a hafnium oxide film (41 nm) and an aluminum oxide film (22 nm) were alternately deposited at 4.5 lamination cycle from the side surface side of the mesa structure.

Figure 6:
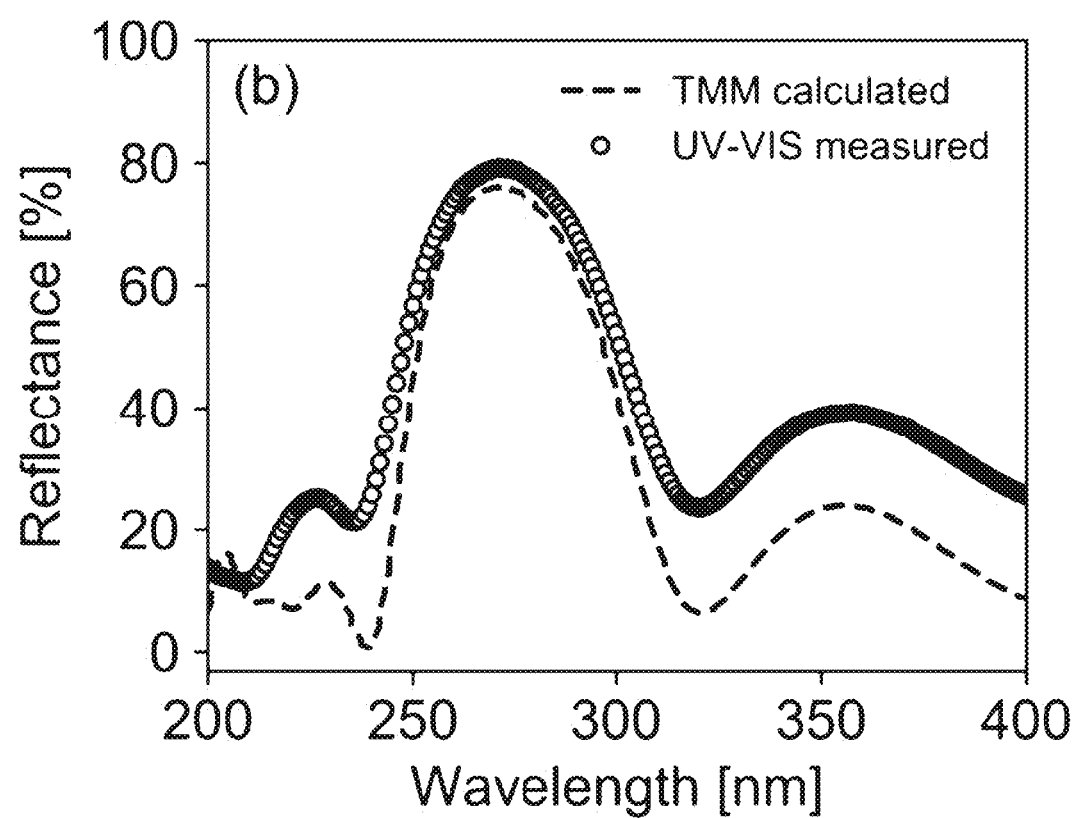
FIG. 6 is a graph showing theoretical reflectance and measured reflectance of a light reflecting layer in Example 1.

Prior to the present Example, a light reflecting layer having the same structure as described above was formed on a sapphire substrate and reflectance of the light reflecting layer was measured. The maximum reflectance was approximately 80% at wavelength: 275 nm, as shown in FIG. 6, which coincided with the theoretical value.

Figure 7:
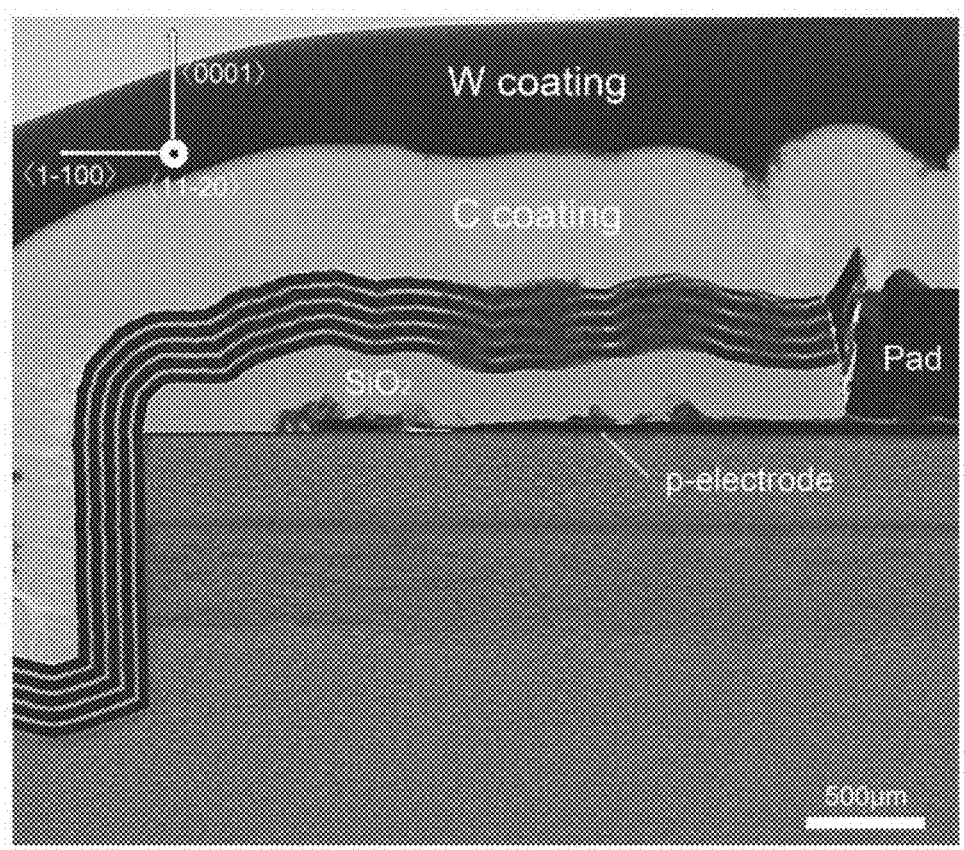
FIG. 7 is a cross-sectional TEM image including a resonator end face of a laser diode in Example 1.

FIG. 7 is a cross-sectional TEM image including a resonator end face of the laser diode. It is understood that the light reflecting layer obtained by the method of the present embodiment uniformly covers a side surface of the mesa structure. That is, it is understood that a uniform light reflecting layer can be formed on a side surface of the mesa structure including a resonator end face by "On-Wafer".

Figure 8:
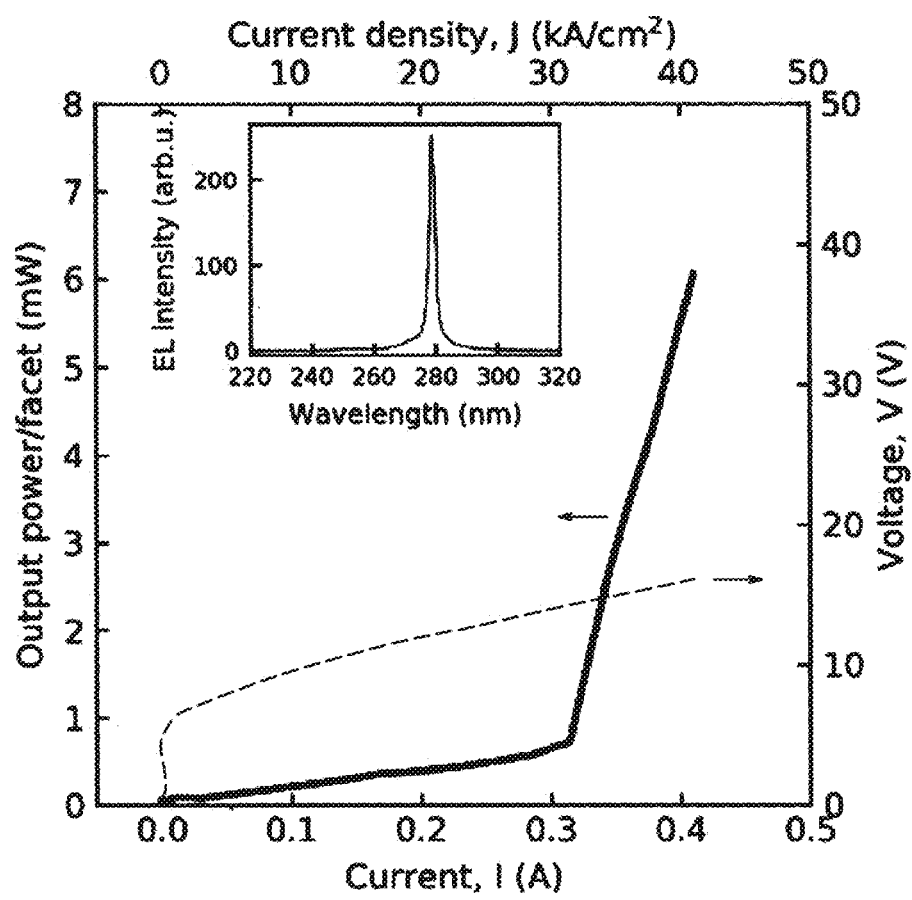
FIG. 8 is a graph showing optical output power (I-L) property plotted as a function of current-voltage (I-V) and pulse current in the forward direction of a laser diode in Example 1.

FIG. 8 shows the end face luminescence intensity (I-L) property vs. current-voltage (I-V) and pulse current in the forward direction of the laser diode thus prepared. The end face luminescence intensity was detected by a photomultiplier tube. A nonlinear rise-up of the end face luminescence intensity and oscillation under pulse current at the room temperature, of a LD having a mirror end face formed by using etching and ALD, were observed when the forward current exceeded 0.3 A or so (the forward current 0.3 A or so corresponds to 20 $kA/cm^2$ which is a current density in a case where a current path is presumed to be limited to a region right under the p electrode). A sharp spectrum peak appeared at a wavelength of 278.9 nm. The inserted graph in FIG. 8 shows spectrum measured by a spectroscope when the forward current was 0.37 A. The driving voltage in the threshold current was 13.8 V.

Example 2

Figure 9:
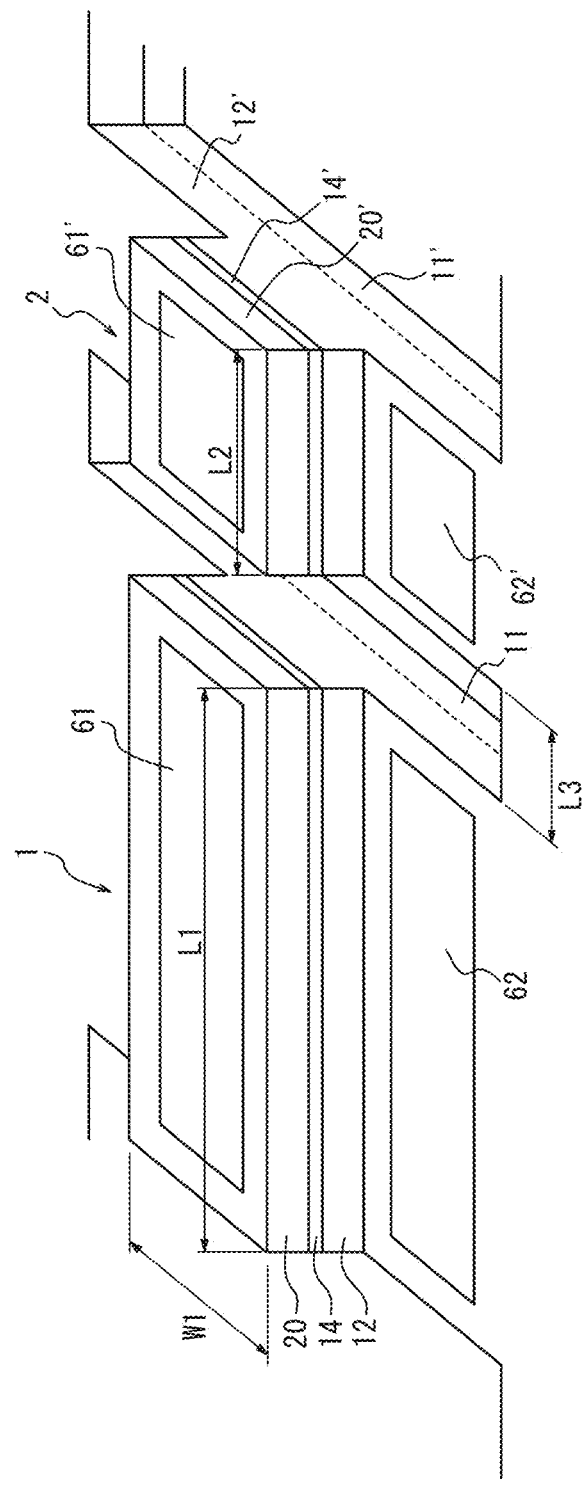
FIG. 9 is a schematic drawing of an optical device having a laser diode and a photodetector in Example 2.

A mesa structure of a photodetector 2 was formed, in addition to the laser diode 1, in the etching process in Example 1. FIG. 9 is a schematic drawing showing in an extracted manner a recurring unit of an optical device provided with the laser diode 1 and the photodetector 2 in Example 2. A plurality of the laser diodes 1 and the photodetectors 2 were prepared by employing the structure shown in FIG. 9 as the recurring unit.

In the drawing, 61 represents a p-type electrode and 62 represents a n-type electrode. The structure of a semiconductor lamination unit of the laser diode 1 and that of the photodetector 2 are identical. A reference number of the structure of the photodetector is differentiated from a corresponding reference number of the laser diode 1 by <'> attached to the former. It should be noted that a light reflecting layer, not shown, similar to that of Example 1 was formed on all side faces including all surfaces and the resonator end faces of the p-type electrode and the n-type electrode, except for the regions thereof for contact with the exterior.

The length L1 of a long side and the length W1 of a short side of the mesa structure of the laser diode 1 were 400 μm and 100 μm, respectively. The length L2 of the mesa structure of the photodetector 2 was 50 μm. The distance L3 between the laser diode 1 and the photodetector 2 was 16 μm. A side surface on the resonator end face side, of the laser diode 1, was etched such that the substrate 11 (11') was exposed in order to mitigate an effect caused by bottom surface reflection.

Although the present invention has been described by the aforementioned embodiment, the technical scope of the invention is by no means limited to the scope of the description of the embodiment. It should be obvious to one skilled in the art that various changes or modifications can be added to the embodiment. Further, it should be obvious from the scope of the claims that the technical scope of the present invention subsumes the embodiments thus changed or modified, as well.

It should be noted that the order to execute the respective processes such as operations, procedures, steps, stages and the like in each device, system, program and method described/shown in the claims, the specification and the drawings can be optionally changed in practice unless specific instructions such as "before . . . ", "prior to . . . " and the like accompany the relevant processes and/or an output of one process should be utilized in another process thereafter. Use of "first", "next" and the like for convenience in explaining an operational flow in the claims, the specification and the drawings does not mean that the operational flow must be executed strictly in the order thus explained.

The invention claimed is:

1. An optical device having a laser diode, wherein the laser diode comprises:
   a substrate;
   a n-type clad layer formed on the substrate and including a nitride semiconductor layer having n-type conductivity;
   a light-emitting layer formed on the n-type clad layer and including at least one quantum well;
   a p-type clad layer formed on the light-emitting layer and including a nitride semiconductor layer having p-type conductivity, and
   a photodetector formed on the substrate, having a mesa structure and capable of receiving and detecting light emitted from the laser diode,
   wherein at least a portion of the n-type clad layer, the light-emitting layer and the p-type clad layer constitute a mesa structure having a resonator end face, and entire side surfaces of the mesa structure are covered with a light reflecting layer,
   wherein all side surfaces of the mesa structure of the photodetector are covered with the light reflecting layer, and
   where a light reflectance of the light reflecting layer is 50% or more with respect to a desired wavelength.

2. The optical device of claim 1, wherein a laser beam receiving face of the photodetector is positioned to be opposed to a main laser beam emitting face of the laser diode.

3. The optical device of claim 1, comprising a plurality of the laser diodes.

4. The optical device of claim 1, wherein the p-type clad layer includes: a p-type longitudinally conductive layer containing $Al_sGa_{1-s}N(0.3 \leq s \leq 1)$, having film thickness smaller than 0.5 μm and a graded Al composition "s" which decreases in the direction away from the top surface of the substrate; and a p-type transversely conductive layer composed of $Al_tGa_{1-t}N(0 < t \leq 1)$.

5. The optical device of claim 1, wherein the light reflecting layer is a dielectric lamination film.

6. The optical device of claim 1, wherein the light reflecting layer is made of oxide of at least one selected from the group consisting of aluminum, hafnium, silicon, titanium, zirconium, lead, and gallium.

7. The optical device of claim 5, wherein the dielectric lamination film is a lamination film in which a hafnium oxide film and an aluminum oxide film are laminated at ≥1 lamination cycle.

8. The optical device of claim 1, wherein the substrate is an AlN substrate and an angle formed by a surface adjacent to the resonator end face, of the light reflecting layer, with respect to the (0001) plane of the AlN substrate is in the range of ≥85° and ≤95°.

9. The optical device of claim 1, wherein the n-type clad layer, the light-emitting layer and the p-type clad layer are AlGaN layers and the (1-100) plane of the AlGaN layers constitutes the resonator end face.

* * * * *